(12) United States Patent
Suetsugu et al.

(10) Patent No.: US 10,763,184 B2
(45) Date of Patent: Sep. 1, 2020

(54) POWER MODULE SUBSTRATE, POWER MODULE, AND METHOD FOR MANUFACTURING POWER MODULE SUBSTRATE

(71) Applicant: KYOCERA Corporation, Kyoto-shi, Kyoto (JP)

(72) Inventors: Kenji Suetsugu, Kagoshima (JP); Akira Takeo, Kagoshima (JP); Kensou Ochiai, Kawasaki (JP)

(73) Assignee: Kyocera Corporation, Kyoto (JP)

( * ) Notice: Subject to any disclaimer, the term of this patent is extended or adjusted under 35 U.S.C. 154(b) by 34 days.

(21) Appl. No.: 16/095,060

(22) PCT Filed: Apr. 25, 2017

(86) PCT No.: PCT/JP2017/016387
§ 371 (c)(1),
(2) Date: Oct. 19, 2018

(87) PCT Pub. No.: WO2017/188254
PCT Pub. Date: Nov. 2, 2017

(65) Prior Publication Data
US 2019/0181066 A1 Jun. 13, 2019

(30) Foreign Application Priority Data

Apr. 26, 2016 (JP) .................................. 2016-088160
Sep. 23, 2016 (JP) .................................. 2016-185720

(51) Int. Cl.
*H01L 23/14* (2006.01)
*H01L 23/373* (2006.01)
(Continued)

(52) U.S. Cl.
CPC .......... *H01L 23/147* (2013.01); *H01L 23/142* (2013.01); *H01L 23/3142* (2013.01);
(Continued)

(58) Field of Classification Search
CPC ... H01L 23/147; H01L 23/36; H01L 23/3142; H01L 23/3735; H01L 24/48;
(Continued)

(56) References Cited

U.S. PATENT DOCUMENTS

2005/0212145 A1 9/2005 Imoto et al.
2010/0059785 A1 3/2010 Lin et al.
2013/0328204 A1* 12/2013 Zommer ................. H01L 24/03
257/765

FOREIGN PATENT DOCUMENTS

JP   2006-202938 A   8/2006
JP   2006-240955 A   9/2006
(Continued)

*Primary Examiner* — David Vu
(74) *Attorney, Agent, or Firm* — Volpe and Koenig, P.C.

(57) ABSTRACT

A power module substrate or the like including an insulating substrate with an upper surface and a lower surface, a metal plate with an upper surface and a lower surface, the lower surface facing and being bonded to the upper surface of the insulating substrate, and a first electroplating layer that partly covers the central portion of the upper surface of the metal plate. The first electroplating layer includes at least a silver layer, and the grain size of silver in the silver layer is more than or equal to the grain size of a metal in an upper surface portion of the metal plate.

18 Claims, 9 Drawing Sheets

(51) Int. Cl.
*H01L 23/31* (2006.01)
*H01L 23/36* (2006.01)
*H01L 23/367* (2006.01)
*H01L 23/00* (2006.01)

(52) U.S. Cl.
CPC ............ *H01L 23/36* (2013.01); *H01L 23/367* (2013.01); *H01L 23/3735* (2013.01); *H01L 24/48* (2013.01); H01L 2224/48091 (2013.01); H01L 2224/73265 (2013.01); H01L 2224/85439 (2013.01); H01L 2224/85444 (2013.01); H01L 2924/00014 (2013.01); H01L 2924/13055 (2013.01); H01L 2924/181 (2013.01)

(58) Field of Classification Search
CPC ................. H01L 23/367; H01L 23/142; H01L 2224/73265; H01L 2224/48091; H01L 2924/00014; H01L 2224/85439; H01L 2924/13055; H01L 2924/181; H01L 2224/85444; H01L 23/3121
See application file for complete search history.

(56) References Cited

FOREIGN PATENT DOCUMENTS

| | | |
|---|---|---|
| JP | 2013-232594 A | 11/2013 |
| JP | 2015-053414 A | 3/2015 |
| WO | 2013/145471 A1 | 10/2013 |
| WO | 2015/087482 A1 | 6/2015 |
| WO | 2015/114987 A1 | 8/2015 |

\* cited by examiner

US 10,763,184 B2

POWER MODULE SUBSTRATE, POWER MODULE, AND METHOD FOR MANUFACTURING POWER MODULE SUBSTRATE

TECHNICAL FIELD

The present disclosure relates to a power module substrate including a metal plate, a power module, and a method for manufacturing a power module substrate.

BACKGROUND ART

To date, for example, power module substrates in which a metal plate composed of a metal material, e.g., Cu, is bonded to the upper surface of an insulating substrate composed of a ceramic sintered body or the like have been used as circuit boards used for electronic apparatuses, e.g., a power module incorporated with electronic components e.g., an insulated gate bipolar transistor (IGBT).

The metal plate in the circuit board forms a circuit for electrically connecting an electronic component to an external electric circuit. The electronic component mounted on the circuit board is electrically connected to the metal plate, the electronic component is covered with a mold resin, and thereby, an electronic apparatus is produced. Regarding such an electronic apparatus, the electronic component and the external electric circuit are electrically connected to each other with the metal plate interposed therebetween.

Recently, a technique to use a silver grain sintered body for bonding an electronic component to a metal plate or the like has been proposed. Also, a technique to dispose a silver layer on the upper surface of a metal plate on which an electronic component is mounted for the purpose of suppressing formation of an oxide film on the metal plate surface has been proposed (refer to, for example, PTL 1).

CITATION LIST

Patent Literature

PTL 1: Japanese Unexamined Patent Application Publication No. 2006-202938

SUMMARY OF INVENTION

A power module substrate according to an aspect of the present disclosure includes an insulating substrate with an upper surface and a lower surface, a metal plate with an upper surface and a lower surface, the lower surface facing and being bonded to the upper surface of the insulating substrate, and a first electroplating layer that partly covers the central portion of the upper surface of the metal plate. The first electroplating layer includes at least a silver layer, and the grain size of silver in the silver layer is more than or equal to the grain size of the metal in the upper surface portion of the metal plate.

A power module according to an aspect of the present disclosure includes the power module substrate having the above-described configuration, an electronic component mounted on the first electroplating layer of the power module substrate, and a resin layer that covers from a portion provided with no first electroplating layer of the upper surface of the metal plate to the electronic component.

A method for manufacturing a power module substrate according to an aspect of the present disclosure includes the steps of preparing an insulating mother substrate with an upper surface and a metal mother board with a lower surface and bonding the upper surface of the insulating mother substrate and the lower surface of the metal mother board by a brazing paste layer in a first step, forming a plating resist partly on an exposed surface of the metal mother board in a second step, forming an electroplating layer on portions provided with no plating resist layer of the exposed surface of the metal mother board in a third step, and removing at least some of portions provided with no electroplating layer of the metal mother board in a fourth step.

DESCRIPTION OF EMBODIMENTS

Regarding a circuit board and the like in the related art, an improvement in the reliability under a severe temperature condition for, for example, vehicle mounting has been an issue. That is, it is necessary that bonding reliability between the resin layer and the circuit board be improved against repetition of thermal stress due to temperature change in a vehicle, for example, an engine room. In addition, reliability in bonding of the silver layer to the metal plate and the like has to be improved. The power module substrate according to the present disclosure can improve such bonding strength between the resin layer and the circuit board and suppress peeling of the silver layer from the metal plate. Therefore, a power module substrate effective for improving the reliability in, for example, sealing of an electronic component by the resin layer can be provided.

The power module substrate, the power module, and the method for manufacturing a power module substrate according to the present disclosure will be described with reference to the drawings. In this regard, distinction between upper and lower in the following description is for the sake of convenience and does not limit the vertical relationship in an actual use of power module substrate, power module, and the like.

(Power Module Substrate and Power Module)

A piece of (single-piece production) power module substrate and a power module including the same will be described.

Figure 1A:
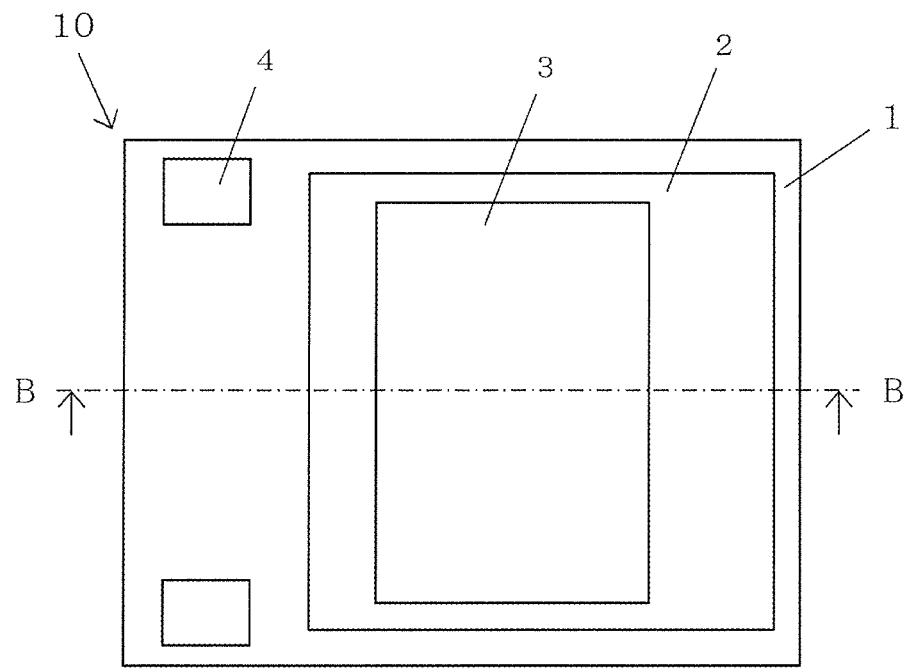
FIG. 1A is a plan view illustrating a power module substrate according to an embodiment of the present disclosure.
Figure 1B:
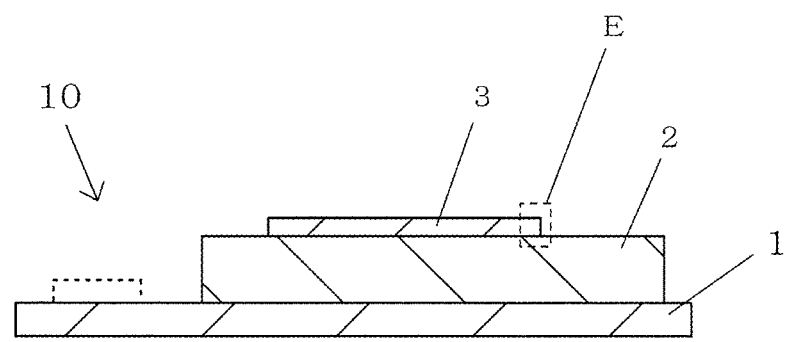
FIG. 1B is a sectional view of a section along line B-B in FIG. 1A.
Figure 2A:
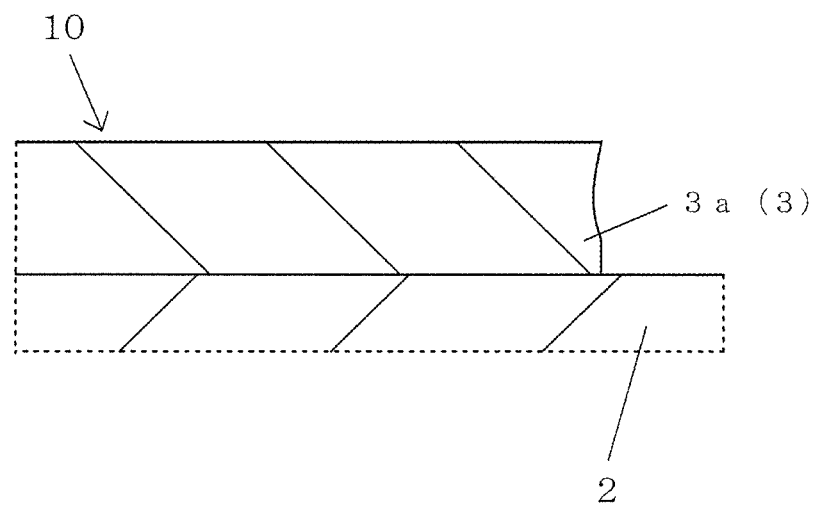
FIG. 2A is a magnified sectional view illustrating an example of portion E in FIG. 1B.
Figure 2B:
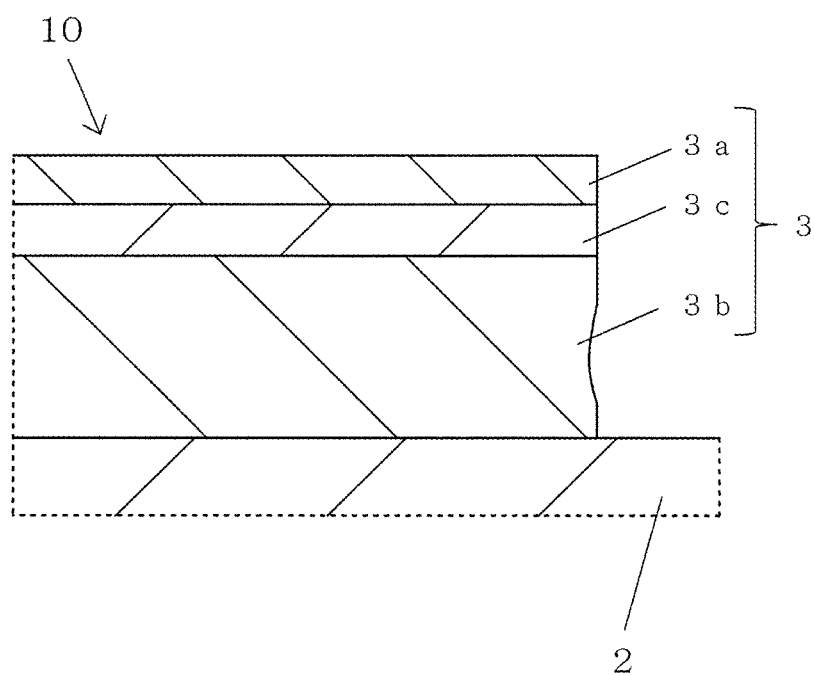
FIG. 2B is a magnified sectional view illustrating another example of portion E in FIG. 1B.
Figure 3A:
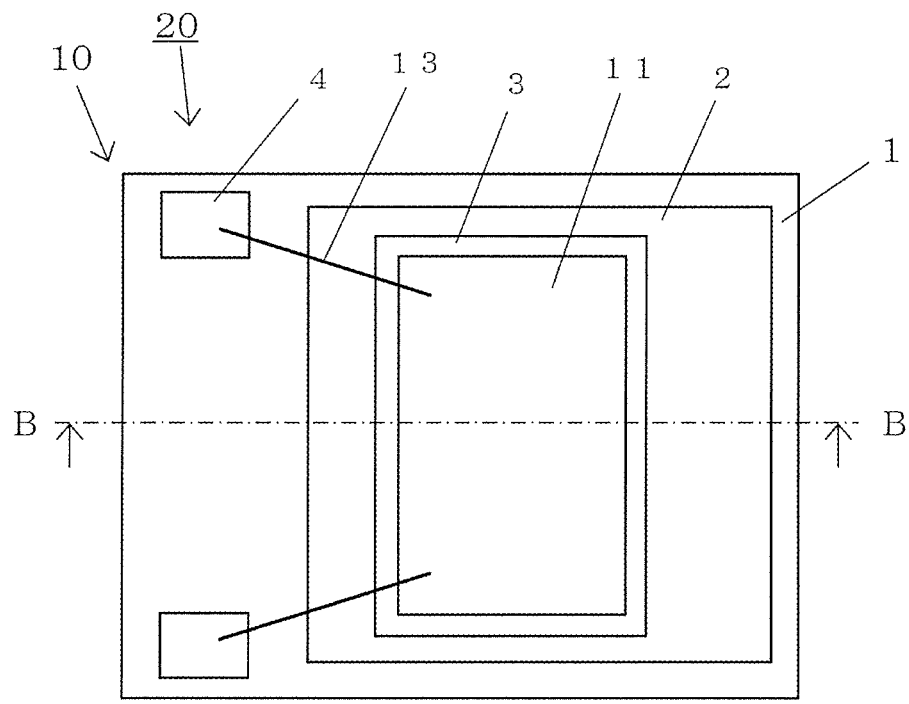
FIG. 3A is a plan view illustrating a power module according to an embodiment of the present disclosure.
Figure 3B:
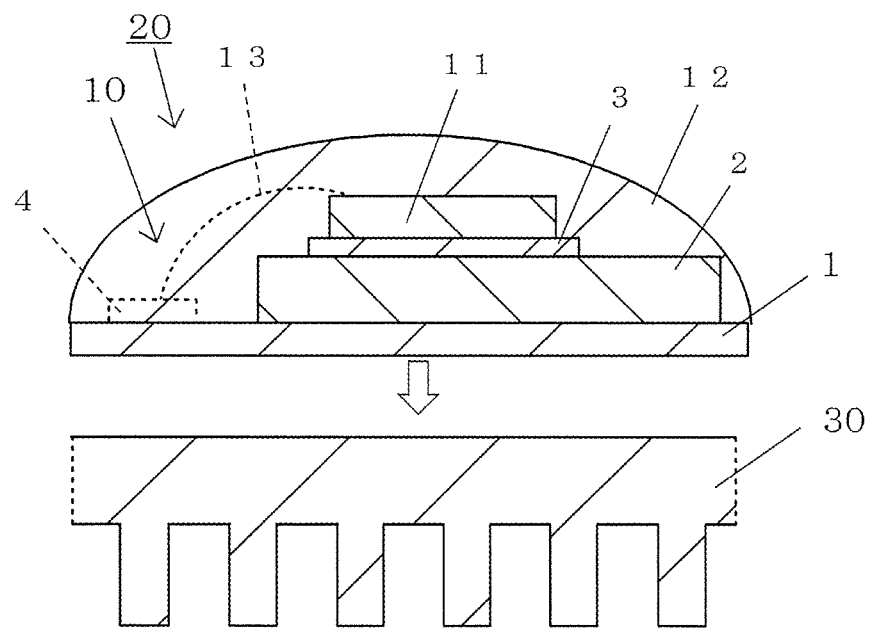
FIG. 3B is a sectional view of a section along line B-B in FIG. 3A.

FIG. 1A is a plan view illustrating a power module substrate according to an embodiment of the present disclosure, and FIG. 1B is a sectional view of a section along line B-B in FIG. 1A. Each of FIG. 2A and FIG. 2B is a magnified sectional view illustrating an example of portion E in FIG. 1B. FIG. 3A is a plan view illustrating a power module according to an embodiment of the present disclosure, and FIG. 3B is a sectional view of a section along line B-B in FIG. 3A. In FIG. 3A, a resin layer 12 is not illustrated.

A power module substrate 10 according to the embodiment includes an insulating substrate 1, a metal plate 2 on the upper surface of the insulating substrate 1, and a first electroplating layer 3 that partly covers the upper surface of the metal plate 2. The first electroplating layer 3 includes at least silver layer 3a. The first electroplating layer 3 may further includes a nickel layer 3b between the silver layer 3a and the upper surface of the metal plate 2. In an example illustrated in FIG. 2B, a palladium layer 3c is further disposed between the silver layer 3a and the nickel layer 3b. An electronic component 11 is mounted on the power module substrate 10, the electronic component 11 is covered with a resin layer 12 and, therefore, a power module 20 according to the embodiment is basically constructed.

The power module substrate 10 according to the embodiment further includes, for example, terminal plates 4 on the upper surface of the insulating substrate 1. The terminal plates 4 function as terminals that are connected to connection members, e.g., a bonding wire 13, for electrically connecting the electronic component 11 to external electric circuits (not illustrated).

In the power module substrate 10 according to the embodiment, the first electroplating layer 3 is partly disposed in the central portion of the upper surface of the metal plate 2. The first electroplating layer 3 includes at least the silver layer 3a. As described above, the first electroplating layer 3 may include other metal layers under the silver layer 3a. In other words, at least the uppermost layer of the first electroplating layer 3 is the silver layer 3a.

The metal plate 2 is formed of a metal material, e.g., copper, or a copper alloy. The first electroplating layer 3 including the silver layer 3a is disposed as described above, and thereby, oxidation and the like of the portion on which the electronic component 11 is mounted of the upper surface of the metal plate 2 can be suppressed. The electronic component 11 is readily bonded and mounted on the metal plate 2 (directly on the silver layer 3a of the first electroplating layer 3), and there are advantages in an improvement of electrical connection reliability.

When the surface roughness of each of the metal plate 2 and the terminal plate 4 is set to be smaller than the surface roughness of the first electroplating layer 3, the bonding reliability between the connection member, e.g., a bonding wire 13, and each of the metal plate 2 and the terminal plate 4 is improved and, thereby, bonding strength between the first electroplating layer 3 and the connection member can be enhanced.

The terminal plate 4 can also be formed by using the same material and the same method as those for the metal plate 2. The exposed surface of the terminal plate 4 may be covered with a plating layer, e.g., a silver layer (not illustrated).

The metal plate 2 and the terminal plate 4 are bonded, that is, brazed, to the insulating substrate 1 by, for example, a brazing material containing an active metal material, e.g., titanium. The brazing material may contain no active metal material. In this situation, an underlying metal layer for brazing (not illustrated) may be disposed at a predetermined location of the upper surface of the insulating substrate 1. The underlying metal layer can be formed as a metallized layer of a metal material containing a metal selected from, for example, silver, copper, indium, zinc, tin, titanium, zirconium, hafnium, niobium, molybdenum, osmium, rhenium, and tungsten at a predetermined location of the upper surface of the insulating substrate 1. The method for bonding the metal plate 2 and the like by the brazing material and the like will be described later in detail as a manufacturing method.

As illustrated in, for example, FIG. 3B, the electronic component 11 to be mounted is sealed by a resin layer 12 that is disposed so as to cover from a portion provided with no first electroplating layer 3 of the upper surface of the metal plate 2 to the electronic component 11. Consequently, the resin layer 12 can be bonded to the upper surface of the metal plate 2 rather than the inert silver layer 3a. As a result, the reliability in sealing of the electronic component 11 by the resin layer 12 can be effectively improved.

The insulating substrate 1 is a base portion that fixes and supports the metal plate 2. When a power module 20 is thermally connected to an external heat dissipation member 30, e.g., a heat dissipation fin, the insulating substrate 1 can also function as an insulating member that electrically insulates each of the metal plate 2 and the terminal plate 4 from the heat dissipation member 30.

As described above, when the electronic component 11 is bonded to and mounted on the metal plate 2, the silver layer 3a of the first electroplating layer 3 has functions of facilitating bonding of the electronic component 11 and improving the connection reliability.

The silver layer 3a of the first electroplating layer 3 is a polycrystalline substance formed by bonding a number of grains of silver (silver crystal grains) (not illustrated). The metal plate 2 is a polycrystalline substance formed by bonding a number of grains of a metal, e.g., copper, (metal crystal grains) (not illustrated). The grain size of silver (grain) in the silver layer 3a is more than or equal to the grain size of the metal (grain) of the upper surface portion of the metal plate 2. In this regard, the grain size is, for example, an arithmetic average grain size of a plurality of grains. In other words, the average grain size of silver grains constituting the silver layer 3a is more than or equal to the average grain size of metal grains in a portion in direct contact with the silver layer 3a or in the vicinity of the portion in the metal plate 2.

The silver grain size is relatively large. Therefore, the metal, e.g., copper, constituting the metal plate 2 does not readily diffuse into the silver layer 3a, and peeling of the silver layer 3a from the metal plate 2 resulting from generation of an intermetallic compound between the metal and silver can be suppressed. In more detail, the grain boundary density between grains per unit area of the silver layer 3a decreases because the silver grain size of the silver layer 3a is relatively large. The grain boundaries readily serve as paths for diffusion of a metal component and, therefore, a metal component that diffuses from the metal plate 2 does not readily diffuse from grain boundaries into grains in the silver layer 3a. In addition, the grain size of silver is more than the grain size of the metal in the metal plate 2 and, therefore, regions in which grain boundaries of the metal in the metal plate 2 overlap the grain boundaries of the silver layer 3a in plan view when viewed from the side of the silver layer 3a can be made small. Consequently, the component in the metal plate 2 does not readily diffuse from grain boundaries in the metal plate 2 through grain boundaries in the silver layer 3a. As a result, diffusion of the metal component into the silver layer 3a can be suppressed.

The above-described effects are enhanced as the grain size of silver increases. In consideration of operational ease in formation of the silver layer 3a (that is, productivity and the like of the power module substrate 10), economy, and the like, the average grain size of silver may be, for example, within the range of about 40 to 200 µm.

In an example in which the metal plate 2 is composed of copper and the grain size of copper in the upper surface portion of the metal plate 2 is about 40 to 130 µm, the grain size of silver in the silver layer 3a may be set to be about 50 to 200 µm.

In order to effectively obtain the above-described effects, the grain size of silver in the silver layer 3a may be set to be about 10 to 100 µm larger than the grain size of the metal, e.g., copper, in the upper surface portion of the metal plate 2.

The grain size of the silver layer 3a can be adjusted to fall within a predetermined range by, for example, adjusting the conditions, e.g., the magnitude of voltage and the current density during electroplating and the type and the amount of additive added to the plating solution, or adjusting the heat treatment condition and the like of the silver layer 3a after electroplating.

In this regard, the upper surface portion of the metal plate 2 refers to the upper surface and a portion from the upper surface to the depth of about 10 µm. The distance from the upper surface portion to the silver layer 3a is relatively small and, therefore, there is a high possibility that the metal component contained in the upper surface portion diffuses into the silver layer 3a.

The grain size of silver in the silver layer 3a and the grain size of the metal in the upper surface portion of the metal plate 2 can be detected by, for example, measuring the grain size of metal grains on the basis of surface observation by a metallurgical microscope. The grain size in this situation is calculated by a method referred to as an intercept method in general. In the intercept method, a straight line is drawn on a sample cross section, and the number of metal grains crossed by the straight line are counted. Then, the length of the straight line is divided by the number of metal grains counted, and the resulting length is assumed to be the grain size. That is, the grain size in this situation is an average size of metal grains crossed by the straight line. In this regard, the grain size in the metal plate 2 in contact with the silver layer 3a in plan view may be measured before the silver layer 3a is formed or be measured after the silver layer 3a is formed and the silver layer 3a is peeled by a mechanical method or the like.

As described above, the first electroplating layer 3 may further include the nickel layer 3b, or further include the nickel layer 3b and the palladium layer 3c that are sequentially attached to the upper surface of the metal plate 2.

The nickel layer 3b has a function of enhancing the bonding strength of the first electroplating layer 3 to the metal plate 2. The nickel layer 3b has a property that the adhesion strength to a member to be plated (metal plate 2), for example, copper, is high. Consequently, the first electroplating layer 3 is firmly attached to the upper surface of the metal plate 2 by the nickel layer 3b.

In the power module substrate 10 according to the embodiment, the palladium layer 3c is disposed between the nickel layer 3b and the silver layer 3a. The palladium layer 3c has a function of suppressing diffusion of the nickel component in the nickel layer 3b into the silver layer 3a.

In addition, the palladium layer 3c has also a function of improving the solder wettability when the electronic component 11 is mounted on the first electroplating layer 3 with, for example, solder interposed therebetween (not illustrated). For example, even if part of the silver layer 3a is dissolved into solder, the palladium layer 3c is readily wetted by the solder. Consequently, the wettability of the solder can be improved.

When the first electroplating layer 3 is the silver layer 3a, that is, when the first electroplating layer 3 is composed of only the silver layer 3a, the number of steps of plating, etching, and heating can be reduced. When the covering material is removed, reduction in mechanical strength of the insulating substrate 1 and the first electroplating layer 3 due to a removing agent can be suppressed. In addition, the cost of the power module substrate 10 can be reduced because of a reduction in the number of steps.

When the first electroplating layer 3 includes the silver layer 3a and the nickel layer 3b disposed just under the silver layer 3a, that is, when the first electroplating layer 3 is composed of only the nickel layer 3b and the silver layer 3a that are sequentially attached to the upper surface of the metal plate 2, diffusion of the metal, e.g., copper, from the metal plate 2 to the insulating substrate 1 can be suppressed. Consequently, the thickness of the silver layer 3a in the first electroplating layer 3 can be decreased, and the cost of the power module substrate 10 can be reduced.

The silver layer 3a can be formed by, for example, applying electroplating in a cyan-based electrosilvering solution containing silver cyanide as a primary component at predetermined current density and time to the metal plate 2 provided with the nickel layer 3b and the palladium layer 3c. The resulting silver layer 3a is, for example, a so-called pure silver layer containing 99.99% by mass or more of silver. The silver layer 3a may be directly attached to the upper surface of the metal plate 2 as in the above-described example.

The nickel layer 3b can be formed by, for example, applying electroplating in a nickel plating solution, e.g., a Watts bath containing nickel sulfate and the like as a primary component at predetermined current density and time to the metal plate 2. The resulting nickel layer 3b is, for example, a metal layer containing nickel as a primary component and a metal component, e.g., cobalt.

The palladium layer 3c can be formed by, for example, applying electroplating in a palladium plating solution containing a palladium amine complex as a primary component at predetermined current density and time to the metal plate 2 provided with the nickel layer 3b. The resulting palladium layer 3c is, for example, a so-called pure palladium layer containing 99.99% by mass or more of palladium.

When the first electroplating layer 3 includes the nickel layer 3b, the palladium layer 3c, and the like, the grain size of silver in the silver layer 3a may be larger than the grain size of each of the nickel grains (not illustrated) contained in the nickel layer 3b and the palladium grains (not illustrated) contained in the palladium layer 3c. The above-described grain size of nickel and grain size of palladium are the average grain size in the same manner as the grain size of silver in the silver layer 3a, and may be measured by the same method.

In this situation, diffusion of metal components, e.g., nickel and palladium, into the silver layer 3a can be suppressed by relatively large silver grains in the silver layer 3a.

In the same manner as the grain size of silver in the silver layer 3a, the grain size of nickel grains in the nickel layer 3b and the grain size of palladium grains in the palladium layer 3c can also be adjusted to fall within predetermined ranges by adjusting the voltage and the current during plating, the type and the amount of additive added to the plating solution, and various conditions for heat treatment after plating, for example.

In the above-described plating step, for example, the first electroplating layer 3 can be disposed in only the central portion of the upper surface of the metal plate 2 by covering the portion other than the central portion of the upper surface of the metal plate 2 with a covering material composed of a resin material or the like. In this regard, the covering material is removed by a mechanical or chemical method after the plating step. Mechanical removal is a method in which the resin material is peeled off by a jig or the like, and chemical removal is a method in which the resin material is removed by an organic solvent or a removing agent, e.g., an organic acid. The method for manufacturing the power module substrate 10 including, for example, formation of the first electroplating layer 3 by using the covering material will be described later in detail.

As illustrated in, for example, FIG. 2B, when the first electroplating layer 3 includes the nickel layer 3b, the end surface of the nickel layer 3b may be exposed at the side surface of the first electroplating layer 3. In other words, it is not necessary that the entire surface of the exposed surface of the first electroplating layer 3 be the silver layer 3a, and metals other than silver may be present partly. Examples of metals other than silver include palladium, nickel, and cobalt.

When the end surface of the nickel layer 3b is exposed at the side surface of the first electroplating layer 3, the bonding strength of the resin layer 12 to the first electroplating layer 3 can be enhanced because the surface at which the nickel layer 3b is exposed is more active compared with the silver layer 3a.

Figure 4A:
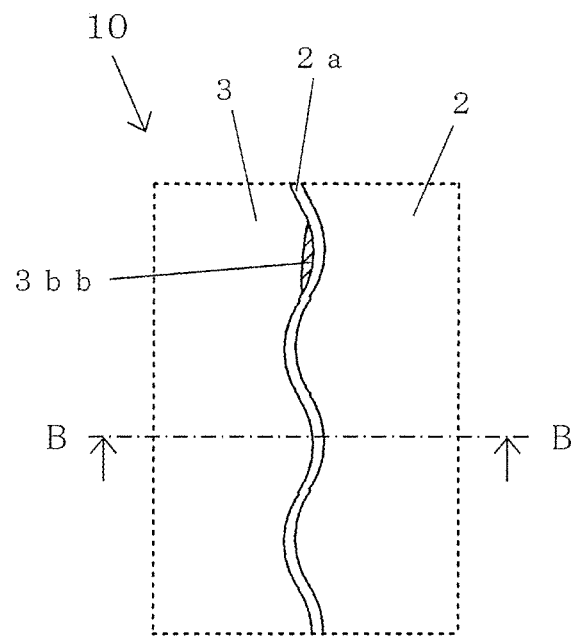
FIG. 4A is a magnified plan view illustrating a main portion in an example of the power module substrate illustrated in FIG. 1A and FIG. 1B, and each of FIG. 4B
Figure 4B:
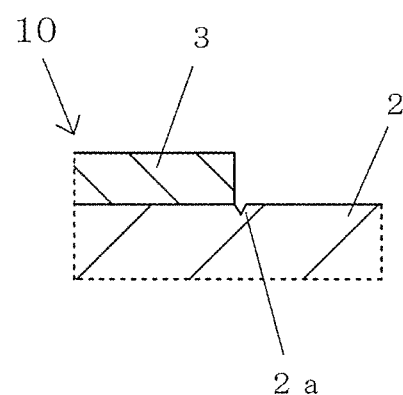
FIG. 4C is a sectional view illustrating an example of a section along line B-B in FIG. 4A.
Figure 4C:
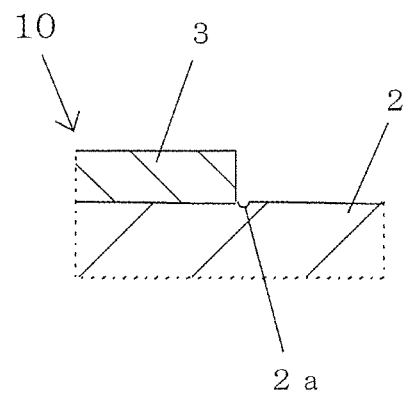

In the power module substrate 10 and the power module 20 according to the embodiment, as illustrated in, for example, FIG. 4A, the outer perimeter of the first electroplating layer 3 may have an uneven shape in plan view. FIG. 4A is a magnified plan view illustrating a main portion in a modified example of the power module substrate illustrated in FIG. 1A, and FIG. 4B is a sectional view illustrating a section along line B-B in FIG. 4A, and FIG. 4C is a sectional view illustrating another example of the section along line B-B in FIG. 4A. In FIG. 4A to FIG. 4C, the same parts as those in FIG. 1A and FIG. 1B are indicated by the same reference numerals as in FIG. 1A and FIG. 1B.

The upper surface of the first electroplating layer 3 illustrated in FIG. 4A to FIG. 4C is the upper surface of the silver layer 3a. Meanwhile, when the palladium layer 3c and the nickel layer 3b are disposed under the silver layer 3a, the outer perimeters of the palladium layer 3c and the nickel layer 3b also have uneven portions. When such uneven portions are included, the stress due to difference in thermal expansion between the first electroplating layer 3 and the metal plate 2 is effectively dispersed along the uneven shape in the plane direction. Consequently, a possibility of the stress linearly concentrating along the outer perimeter of the first electroplating layer 3 is reduced, and the stress applied to the outer perimeter portion of the first electroplating layer 3 is relaxed. As a result, the bonding reliability between the first electroplating layer 3 and the metal plate 2 is effectively improved.

It is not necessary that such an uneven portion extend along the entire outer perimeter of the first electroplating layer 3. For example, the uneven portion may extend along only side portions of the outer perimeter of a rectangular metal plate 2 in plan view or be disposed at the corners and in the vicinity of the corners. That is, the range of the uneven portion may be appropriately set in consideration of the magnitude of stress that may be generated between the metal plate 2 and the first electroplating layer 3, economy (cost), and the like.

When the first electroplating layer 3 includes the nickel layer 3b, nickel 3bb may be exposed at the silver layer 3a in the uneven portion. That is, in plan view, nickel 3bb may be present in at least part of the uneven portion of the outer perimeter of the first electroplating layer 3. In this regard, the bonding strength between the upper surface of the first electroplating layer 3 and the resin layer 12 can also be enhanced by nickel 3bb having a relatively active surface. Consequently, the reliability of sealing of the electronic component 11 by the resin layer 12 can be effectively improved.

Such nickel 3bb is, for example, part of nickel component contained in the nickel layer 3b and is disposed by diffusion of the nickel component.

In an example illustrated in, for example, FIG. 4A to FIG. 4C, the upper surface of the metal plate 2 may have a depression 2a in a portion along the outer perimeter of the first electroplating layer 3. In the example illustrated in FIG. 4A to FIG. 4C, the depression is in the shape of a groove.

In this regard, when the electronic component 11 is covered and sealed with the resin layer 12, the bonding area between the metal plate 2 and the resin layer 12 can be increased by making part of the resin layer 12 enter the depression 2a. Regarding the shape of the depression 2a, the inner side surface enters the metal plate 2 downward from the upper surface. Therefore, the bonding interface between the metal plate 2 and the resin layer 12 can have a complicated shape such that the stress e.g., thermal stress, is generated in a plurality of directions. Consequently, the strength and the reliability of bonding between the metal plate 2 and the resin layer 12 can be more effectively improved compared with the effect of simply increasing the bonding area.

The above-described depression 2a can be disposed by, for example, removing the portion along the outer perimeter of the first electroplating layer 3 of the upper surface of the metal plate 2 to some extent when the covering material is removed after the above-described plating step. For example, regarding the removing agent that chemically removes (dissolves) the covering material, an aqueous solution of ferric chloride or the like that functions to dissolve part of the upper surface of the metal plate 2 containing copper as a primary component may be used.

In this regard, the inner side surface of the depression 2a may be inwardly inclined or curved from the opening toward the bottom of the depression 2a. In other words, in vertical sectional view of the metal plate 2, the depression 2a may be in the shape of a so-called inverted triangle as in the example illustrated in FIG. 4B or in the shape of a semicircle with the diameter portion up as in the example illustrated in FIG. 4C.

When the inner side surface of the depression 2a is inclined or curved as described above, part of the resin layer 12 readily enters the depression 2a from the opening of the depression 2a. In addition, the depression 2a is readily filled with part of the resin layer 12, that is, the bonding area between the resin layer 12 and the metal plate 2 in the depression 2a is readily increased. Consequently, the strength and the reliability of the above-described bonding between the resin layer 12 and the metal plate 2 can be effectively improved.

Regarding the depression 2a in which the inner side surface is inclined or curved as described above, for example, when the depression 2a in the shape of a groove is formed by using the above-described removing agent, the depression 2a can be formed by appropriately adjusting the concentrations of the components of the removing agent, the liquid temperature, the removing time, and the like (that is, the rate, time, and the like of dissolution of copper).

The surface roughness of the inner side surface of the depression 2a may be more than the surface roughness of the upper surface of the metal plate 2. In this situation, bonding between the inner side surface of the depression 2a and part of the resin layer 12 is effectively enhanced by an anchor effect of the relatively rough inner side surface. Therefore, the strength and the reliability of bonding between the resin layer 12 and the metal plate 2 can be effectively improved.

The depression 2a having surface roughness of the inner side surface more than the surface roughness of the upper surface of the metal plate 2 can be formed by, for example, mechanically or chemically roughening the inner side surface of the depression 2a.

The surface roughness of each of the inner side surface of the depression 2a and the upper surface of the metal plate 2 is, for example, arithmetic average roughness and can be measured by a method, e.g., a measuring method by using an atomic force microscope.

Figure 5:
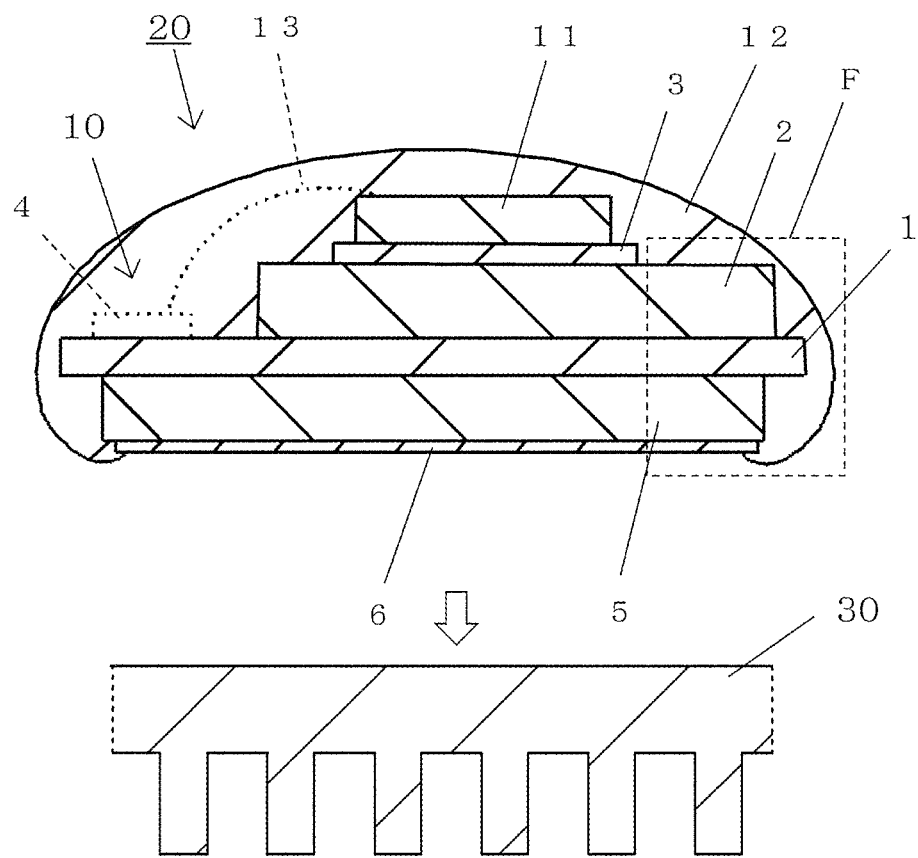
FIG. 5 is a sectional view illustrating a power module substrate and a power module according to another embodiment of the present disclosure.

FIG. 5 is a sectional view illustrating a power module substrate 10 and a power module 20 according to another embodiment of the present disclosure. In FIG. 5, the same parts as those in FIG. 1A and FIG. 1B are indicated by the same reference numerals as in FIG. 1A and FIG. 1B. In the example illustrated in FIG. 5, the power module substrate 10 and the power module 20 further include a heat dissipation plate 5 with an upper surface and a lower surface, the upper surface facing and being bonded to the lower surface of the insulating substrate 1. In addition, a second electroplating layer 6 that covers the lower surface of the heat dissipation plate 5 is further included. At least part of the outer perimeter of the second electroplating layer 6 is apart from the outer perimeter of the lower surface of the heat dissipation plate 5.

The heat dissipation plate 5 has a function to dissipate heat to the outside when the heat generated from the electronic component 11 is conducted through the metal plate 2 and the insulating substrate 1 to the lower surface of the insulating substrate 1. Consequently, the heat dissipation of the power module 20 is enhanced, and long-term operational reliability of the electronic component 11 is improved. The power module 20 having the above-described configuration can be readily produced by using the power module substrate 10 including such a heat dissipation plate 5.

The heat dissipation plate 5 can be produced by, for example, using the same material and the same method as those for the metal plate 2. The heat dissipation plate 5 can be bonded to the insulating substrate 1 by the same bonding method (brazing or the like) as that of the metal plate 2.

The power module 20 illustrated in FIG. 5 is formed by mounting the electronic component 11 on the power module substrate 10 having a configuration including the heat dissipation plate 5 and the second electroplating layer 6. The second electroplating layer 6 may contain a nickel layer as a primary component. In the power module 20 of this form, the resin layer 12 is disposed so as to cover the outer perimeter of the lower surface of the heat dissipation plate 5 to the electronic component 11. Consequently, the reliability of sealing of the electronic component 11 is improved. In order to enhance thermal connection of the power module 20 to a heat dissipation member 30, the central portion of the heat dissipation plate 5 is not covered with the resin layer 12. In this regard, for example, the resin layer 12 may be disposed only on the upper surface side of the insulating substrate 1, as in the example illustrated in FIG. 3B, in consideration of productivity, economy, and the like.

The size of the heat dissipation plate 5 in plan view is set to be, for example, larger than or equal to the size of the metal plate 2 and smaller than the insulating substrate 1. If the heat dissipation plate 5 and the metal plate 2 are the same in size, a difference in thermal stress between on and under the insulating substrate 1 is reduced when the metal plate 2 and the heat dissipation plate 5 are bonded to the insulating substrate 1. Therefore, there are advantages in suppressing warp of the power module substrate 10. If the heat dissipation plate 5 is larger than metal plate 2, the heat generated during use of the power module 20 can be effectively diffused in the horizontal direction of the heat dissipation plate 5, and there are advantages in enhancing the heat dissipation.

If the heat dissipation plate 5 is set to be smaller than the insulating substrate 1, electric insulation between the heat dissipation plate 5 and the metal plate 2 can be improved.

When oxygen is contained as a component of the metal plate 2, a small content in the metal plate 2 has advantages in enhancing the bonding strength between a bonding wire 13 and the metal plate 2.

The power module substrate 10 and the power module 20 in this form further include the second electroplating layer 6 that covers the lower surface of the heat dissipation plate 5. At least part of the outer perimeter of the second electroplating layer 6 is apart from the outer perimeter of the lower surface of the heat dissipation plate 5. In other words, at least part of the outer perimeter portion of the lower surface of the heat dissipation plate 5 is exposed without being covered with the second electroplating layer 6. The entire outer perimeter portion of the lower surface of the heat dissipation plate 5 may be exposed without being covered with the second electroplating layer 6. Alternatively, for example, the outer perimeter of the second electroplating layer 6 has an uneven shape in plan view, and the lower surface of the heat dissipation plate 5 may have a portion which is covered with the second electroplating layer 6 because the outer perimeter of the second electroplating layer 6 extends to the outer perimeter of the lower surface of the heat dissipation plate 5 and a portion in which the lower surface of the heat dissipation plate 5 is exposed because the outer perimeter of the second electroplating layer 6 does not reach the outer perimeter of the lower surface of the heat dissipation plate 5.

When the outer perimeter of the lower surface of the heat dissipation plate 5 is exposed as described above, the bonding strength between the resin layer 12 and the power module substrate 10 is effectively improved by redirecting the resin layer 12 to the outer perimeter of the lower surface of the heat dissipation plate 5 and performing bonding. Consequently, the power module 20 in which the reliability of sealing of the electronic component 11 is effectively improved can be provided. In addition, the power module 20 having the above-described configuration can be readily produced by using such a power module substrate 10 including the heat dissipation plate 5 and the second electroplating layer 6.

In order to apply the second electroplating layer 6 to the heat dissipation plate 5 such that the second electroplating layer 6 is apart from the outer perimeter of the lower surface of the heat dissipation plate 5, for example, there is a method in which electroplating is performed while a portion that is not plated is covered with the covering material in the same manner as the above-described first electroplating layer 3. In this regard, the electroplating may be performed by using the same plating solution and the same method as those of the first electroplating layer 3.

The second electroplating layer 6 contains 95% by mass or more of nickel and, therefore, contains nickel as a primary component. The second electroplating layer 6 may contain at least one component selected from tin, platinum, zinc, silver, palladium, and the like in addition to the nickel layer. Hereafter a layer containing 95% by mass or more of nickel is simply referred to as a nickel layer.

The second electroplating layer 6 is composed of, for example, a nickel layer (not indicated by reference numeral that denotes a nickel layer). In other words, in the present embodiment, the central portion of the heat dissipation plate 5 is covered with only the nickel layer.

When the second electroplating layer 6 is composed of the nickel layer as described above, solder wettability can be improved because oxidation of the metal plate 2 is suppressed. In addition, a silver layer is not contained and, therefore, the cost of the power module substrate 10 can be reduced.

When the second electroplating layer 6 is composed of the nickel layer, the lower surface and even the side surface of the heat dissipation plate 5 can be covered with the second electroplating layer 6. The bonding strength between the nickel layer having relatively high activity and the resin layer 12 is high, but the bonding strength between the surface of the heat dissipation plate 5, e.g., copper, and the resin layer 12 is further high. Therefore, when a configuration in which the outer perimeter of the lower surface of the heat dissipation plate 5 is exposed, as described above, is adopted, the bonding strength between the resin layer 12 and the power module substrate 10 is further enhanced.

The power module substrate 10 and the power module 20 are not limited to each example in the above-described embodiment, and various modifications can be made within the scope of the gist of the present disclosure.

Figure 6:
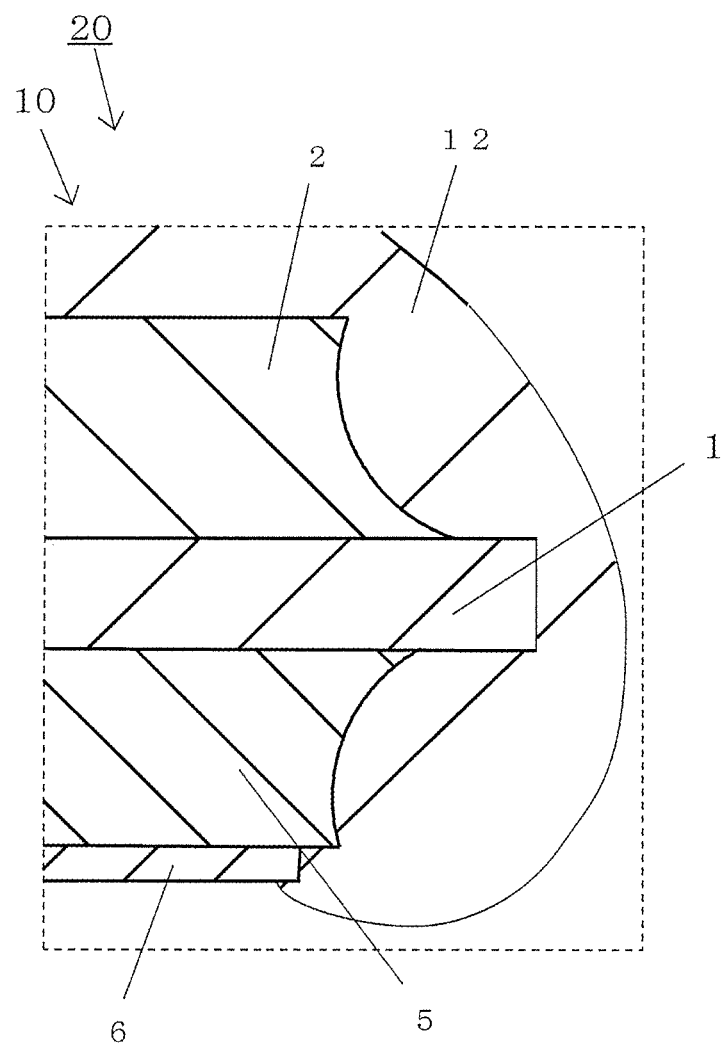
FIG. 6 is a magnified sectional view illustrating an example of portion F in FIG. 5.

For example, the outer side surfaces of the metal plate 2 and the heat dissipation plate 5 may be vertically curved concave surfaces as in the example illustrated in FIG. 6. In this regard, the volume of the metal is relatively decreased in the outer perimeter portions of the metal plate 2 and the heat dissipation plate 5, and thermal stress due to differences in thermal expansion coefficient between the insulating substrate 1 and the metal plate 2 and between the insulating substrate 1 and the heat dissipation plate 5 can be reduced. That is, bonding reliability of each of the metal plate 2 and the heat dissipation plate 5 to the insulating substrate 1 is effectively improved. Such a thermal stress reduction effect can be obtained even when the outer side surface of at least one of the metal plate 2 and the heat dissipation plate 5 is the above-described curved surface. FIG. 6 is a magnified sectional view illustrating an example of portion F in FIG. 5. In FIG. 6, the same parts as those in FIG. 5 are indicated by the same reference numerals as in FIG. 5.

Figure 7:
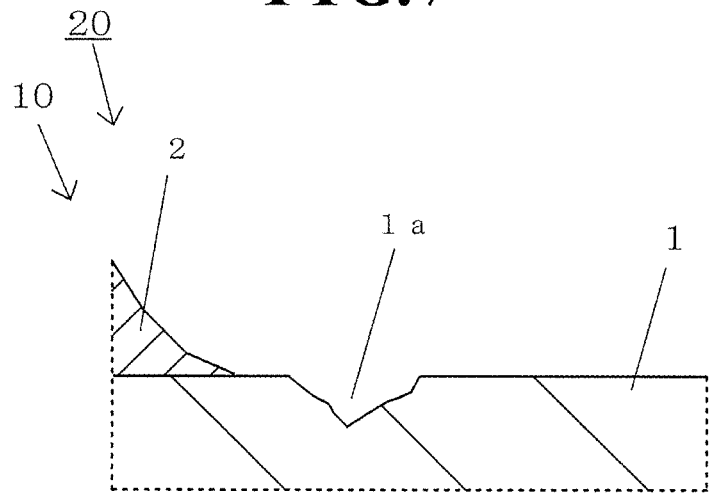
FIG. 7 is a magnified sectional view illustrating the upper surface portion in an example of an insulating substrate included in a power module substrate and a power module according to an embodiment of the present disclosure.

Alternatively, for example, the upper surface of the insulating substrate 1 may have a recessed portion 1a in locations near the outer perimeters of the metal plate 2 and the first electroplating layer 3 as in the example illustrated in FIG. 7. When such a recessed portion 1a is included, the thermal stress between the outer perimeter portion of the metal plate 2 and the insulating substrate 1 can be relaxed. Therefore, bonding reliability of the metal plate 2 to the insulating substrate 1 is effectively improved. FIG. 7 is a magnified sectional view illustrating the upper surface portion in an example of the insulating substrate 1 included in the power module substrate 10 and the power module 20 according to an embodiment of the present disclosure. In FIG. 7, the same parts as those in FIG. 1A and FIG. 1B are indicated by the same reference numerals as in FIG. 1A and FIG. 1B.

The inner side surface of the recessed portion 1a may be inwardly inclined from the opening toward the bottom of the recessed portion 1a in the same manner as the depression 2a of the metal plate 2. Consequently, the insulating substrate 1 can be readily deformed at the portion provided with the recessed portion 1a, thermal stress is readily absorbed between the insulating substrate 1 and the outer perimeter of the metal plate 2, and the reliability of sealing of the electronic component 11 by the resin layer 12 is effectively improved.

(Method for Manufacturing Power Module Substrate)

Next, a method for manufacturing the power module substrate 10 according to an embodiment of the present disclosure will be described with reference to FIG. 8A to FIG. 10C and the like. In this regard, the example in which the power module substrate 10 is produced by dividing a multi-piece power module substrate 110 will be described, but the power module substrate 10 may be produced by single-piece production.

Figure 8A:
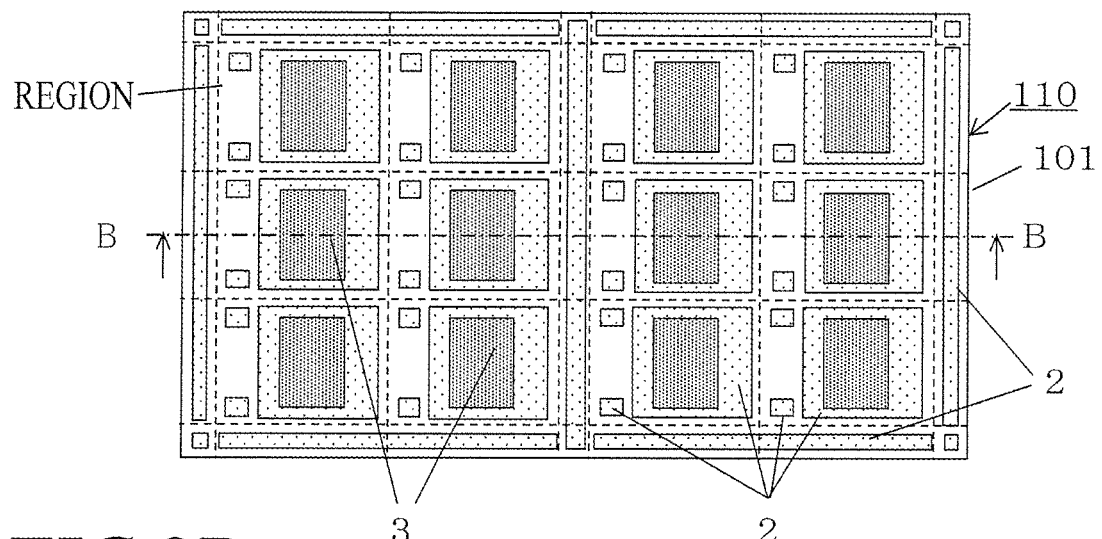
FIG. 8A is a plan view illustrating a multi-piece power module substrate included in a step of producing a power module substrate by a manufacturing method according to an embodiment of the present disclosure.
Figure 8B:
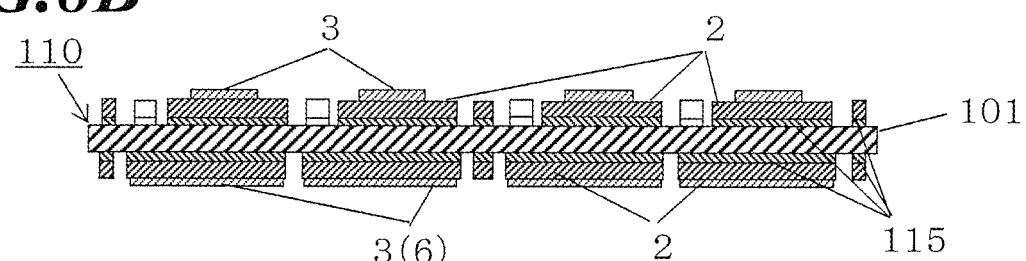
FIG. 8B is a sectional view of a section along line B-B in FIG. 8A.
Figure 8C:
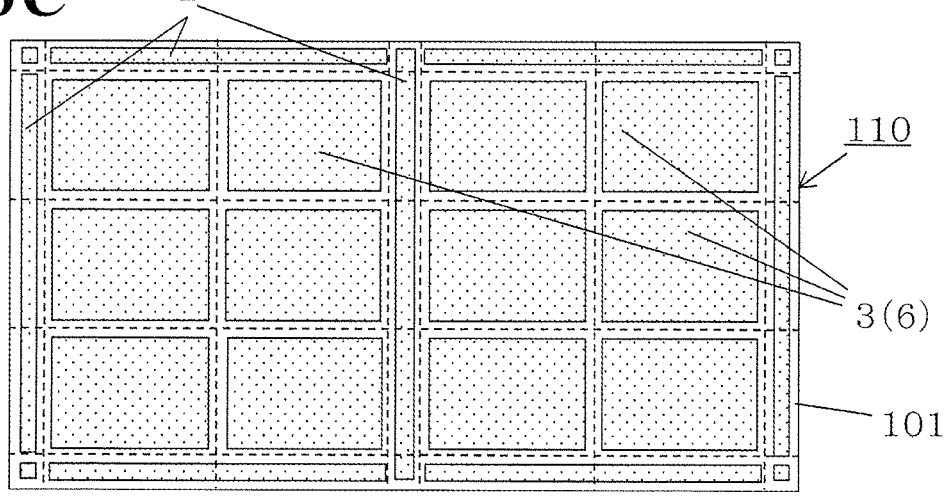
FIG. 8C is a bottom view with respect to FIG. 8A.

FIG. 8A to FIG. 8C illustrate an example of a multi-piece power module substrate 110, and the power module substrates 10 are produced by cutting broken line portions through laser scribing or the like. FIG. 8A is a top view illustrating a multi-piece power module substrate 110, FIG. 8B is a sectional view of a section along line B-B in FIG. 8A, and FIG. 8C is a bottom view. FIG. 9A to FIG. 9C and FIG. 10A to FIG. 10C are sectional views sequentially illustrating the steps in a method for manufacturing the power module substrate 10 according to an embodiment of the present disclosure. The steps illustrated in FIG. 10A to FIG. C follow the steps illustrated in FIG. 9A to FIG. 9C. The multi-piece power module substrate 110 illustrated in FIG. 8A to FIG. 8C can be produced by the steps illustrated in FIG. 9A to FIG. 9C and FIG. 10A to FIG. 10C and can be divided into the respective power module substrates 10 as described above. For ease of distinction, hatching is performed with respect to FIG. 8A and FIG. 8C that are not sectional views.

The configuration of the power module substrate 10 formed by dividing the multi-piece power module substrate 110 produced by the following manufacturing method is the same as the configuration of the power module substrate 10 according to the above-described embodiment. In the following description, explanations of the same items as those in the explanations of the power module substrate 10 according to the embodiment are simplified or not provided.

Figure 9A:
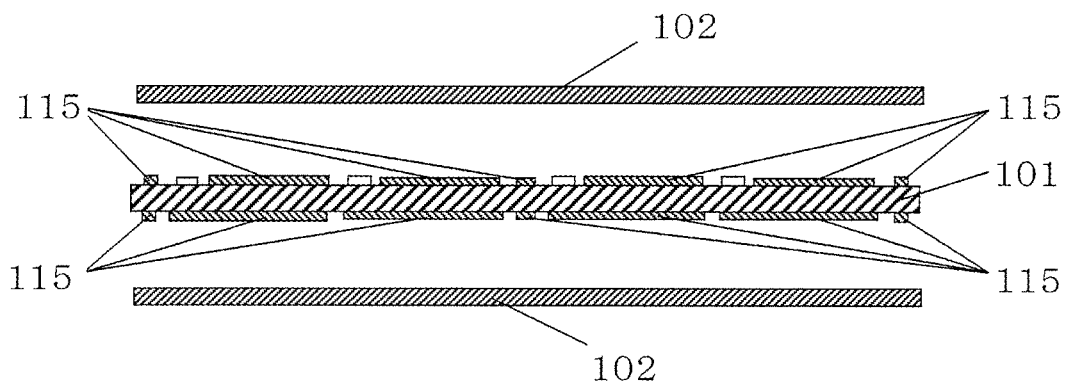
FIG. 9A to FIG. 9C are sectional views illustrating a method for manufacturing a power module substrate according to an embodiment of the present disclosure in the order of steps.
Figure 9B:
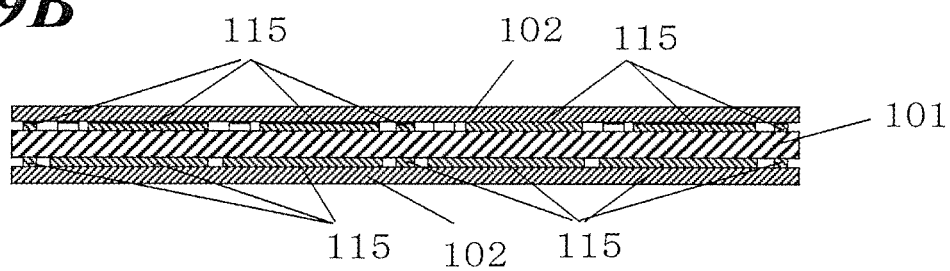

In a first step, as illustrated in FIG. 9A and FIG. 9B, an insulating mother substrate 101 with an upper surface and a metal mother board 102 with a lower surface are prepared, and the upper surface of the insulating mother substrate 101 is bonded to the lower surface of the metal mother board 102 by heating a brazing paste layer 115. FIG. 9A to FIG. 9C and FIG. 10A to FIG. 10C illustrate an example of a multi-piece substrate (multi-piece power module substrate 110). However, for the sake of understanding, the steps are described here as a method for manufacturing a single-piece substrate. The above-described single-piece substrate corresponds to one of regions that are arranged on the multi-piece power module substrate 110 and that are made into respective pieces of power module substrates 10. That is, the method for manufacturing only one region of the multi-piece substrate will be described.

The insulating mother substrate 101 is composed of, for example, the same material as that for the insulating substrate 1 in the power module substrate 10 according to the above-described embodiment and can be produced by the same method.

Regarding the brazing paste layer 115, a brazing material containing the same brazing material component as the brazing material component in the power module substrate 10 according to the above-described embodiment, for example, a Ag—Cu based brazing material, may be used. In this regard, a brazing paste for the brazing paste layer 115 may be produced by kneading a powder of the above-described brazing material with an organic solvent, a paste, and the like.

The brazing paste layer 115 may be produced by further adding a powder of an active metal material of at least one of titanium, hafnium, and zirconium. The brazing paste layer 115 can be arranged by printing the brazing paste for the brazing paste layer 115 on a predetermined location of the upper surface of the insulating mother substrate 101 by a screen printing method or the like. The thickness of the brazing paste layer 115 may be set to be, for example, about 5 to 100 μm.

Figure 9C:
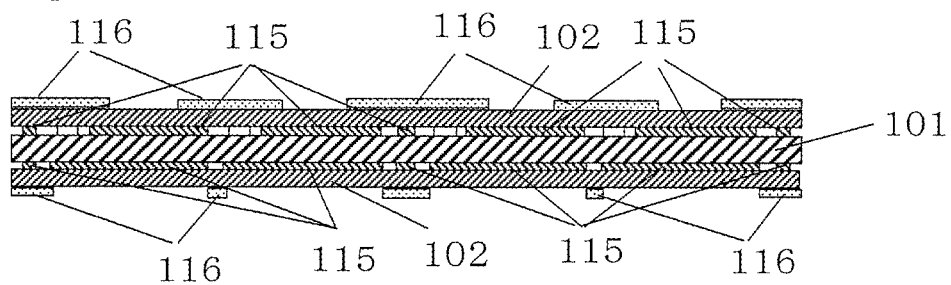

In a second step, as in the example illustrated in FIG. 9C, a plating resist 116 is partly formed on the exposed surface of the metal mother board 102. The plating resist 116 is composed of, for example, the same material as that for the covering material described in the example of the above-described embodiment, and a commercially available plating resist material may be used. For example, the plating resist 116 may be disposed by applying a plating resist ink composed of a resin-based material to the exposed surface of the metal mother board 102 by screen printing or the like and performing heat curing.

Figure 10A:
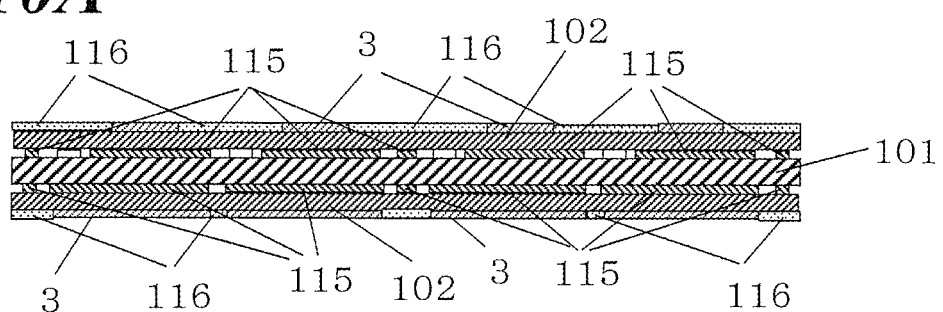
FIG. 10A to FIG. 10C are sectional views illustrating a method for manufacturing a power module substrate according to an embodiment of the present disclosure in the order of steps.

In a third step, as in the example illustrated in FIG. 10A, an electroplating layer is formed on a portion provided with no plating resist 116 of the exposed surface of the metal mother board 102. The resulting electroplating layer corresponds to the first electroplating layer 3 in the power module substrate 10 according to the above-described embodiment and is referred to as a first electroplating layer 3 hereafter. The first electroplating layer 3 may be formed by, for example, the method described with respect to the power module substrate 10 in the above-described embodiment. Specifically, the first electroplating layer 3 may be formed by using a commercially available plating solution. The first electroplating layer 3 can be formed on only portions provided with no plating resist 116 by attaching a plating electrode at an end portion of the metal mother board 102, performing immersion into the plating solution, and precipitating a predetermined thickness of coating at a predetermined current value for a predetermined time. In this regard, the first electroplating layer 3 composed of a silver layer $3a$, a nickel layer $3b$, a palladium layer $3c$, or the like alone or a combination thereof can be formed by using a plurality of types of plating solutions sequentially.

After the first electroplating layer 3 is formed, unnecessary plating resist 116 is removed by the same method as that explained with respect to the power module substrate 10 according to the above-described embodiment.

Figure 10B:
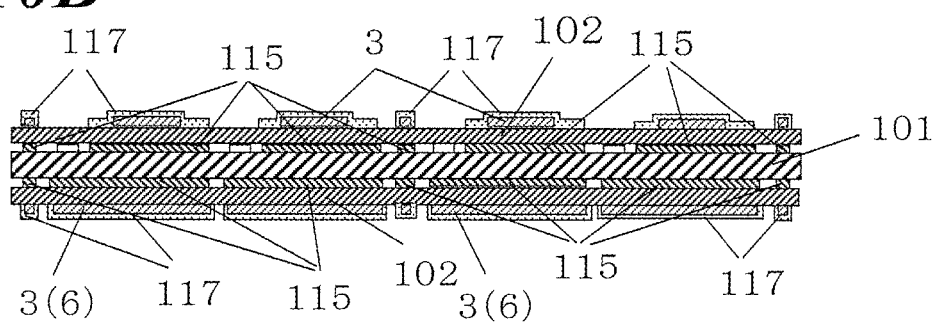
Figure 10C:
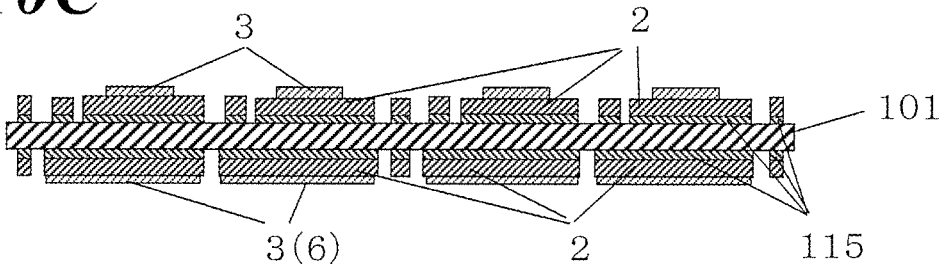

In a fourth step, as in the example illustrated in FIG. 10B and FIG. 10C, at least part of the portion provided with no first electroplating layer 3 of the metal mother board 102 is removed by etching. Some regions of the metal mother board 102 are removed by an etching solution, e.g., ferric chloride, so as to form the metal mother board 102 that functions as a circuit.

In the present example, initially, as illustrated in FIG. 10B, an etching resist 117 is arranged at predetermined locations (portions that are not to be removed) of the metal mother board 102. For example, if ferric chloride is used as the etching solution, the etching resist 117 can be disposed by applying an acid-resistant resist ink by screen printing or the like, and performing heat curing.

Thereafter, as illustrated in FIG. 10C, at least part of the portion provided with no first electroplating layer 3 of the metal mother board 102 is removed by processing, e.g., etching. Subsequently, unnecessary portions of the insulating mother substrate 101 are divided and removed. The insulating mother substrate 101 can be divided by a cutting process, for example, laser processing or dicing processing. Alternatively, slits may be made into, for example, the upper surface of the insulating mother substrate 101 by the above-described processing and, thereafter, the insulating mother substrate 101 may be divided by being mechanically cleaved (broken) along the slits. In this manner, the power module substrate 10 illustrated in, for example, FIG. 1A to FIG. 1B can be produced.

According to the above-described manufacturing method, a thick first electroplating layer 3 can be readily ensured and a fine plating shape can be formed by forming the plating resist 116 on the metal mother board 102 and performing electroplating. So-called thick plating can readily be performed by electroplating and, therefore, long-term heat-dissipation reliability of the power module substrate 10 required to have thermal resistance can be improved. In addition, when the plating resist 116 is formed repeatedly, multicolor plating with respect to different plating layers (first electroplating layer 3·second electroplating layer 6) can readily be performed. Consequently, flexibility in plating is increased, and the first electroplating layer 3 can be formed in accordance with required characteristics. For example, gold plating, palladium plating, or the like is applied to the part required to have wire bondability, silver plating, gold plating, or the like is applied to the part required to have die bondability, and nickel plating or the like is applied to the part required to have mold resin adhesiveness and the like necessary for a power module substrate. Therefore, plating can be applied to each part in accordance with the need.

The manufacturing method in which single-piece production is adopted exerts the above-described effects. Meanwhile, multi-piece production may be adopted. In this regard, in the first step, as illustrated in FIG. 9A and FIG. 9B, the upper surface of the insulating mother substrate 101 is bonded to the lower surface of the metal mother board 102 by a plurality of brazing paste layers 115 independent of each other. Subsequently, in the second step, as in the example illustrated in FIG. 9C, the plating resists 116 are formed so as to be located at locations above portions between a plurality of bonding regions respectively bonded by the plurality of brazing paste layers 115. Further, in the third step, as in the example illustrated in FIG. 10A, electroplating is applied to portions provided with no plating resist 116 of the exposed surface of the metal mother board 102. Then, in the fourth step, as in the example illustrated in FIG. 10B and FIG. 10C, the portions between the bonding regions of the metal mother board 102 are removed by etching or the like so as to divide the metal mother board 102 into a plurality of metal plates 2 apart from each other. The multi-piece power module substrate 110 (in the form of multi-piece production) is produced by the above-described steps. The multi-piece power module substrate 110 is divided in the same manner as that described above and, thereby, the power module substrates 10 are produced. The multi-piece power module substrate 110 can increase the productivity of a highly heat-resistant and highly reliable power module substrate 10 because the thick first electroplating layers 3 can be formed on a plurality of metal circuit board by only ensuring a plating electrode at one place.

The multi-piece power module substrate that is produced in one step (midstream step) of the above-described manufacturing method includes the insulating mother substrate 101 with the upper surface and the metal plate 2 with the lower surface, the upper surface of the insulating mother substrate 101 being bonded to the lower surface of the metal mother board 102 by a plurality of brazing paste layers 115 independent of each other, and includes the first electroplating layers 3 on some of upper surfaces of a plurality of metal plates 2. Such a multi-piece power module substrate 110 is a highly heat-resistant and highly reliable multi-piece power module substrate 110 because a thick first electroplating layer 3 is readily formed in multi-piece production. In addition, the multi-piece power module substrate 110 produced by the above-described method has high locational accuracy of arrangement of each power module substrate 10 (region) in multi-piece production and, therefore, the electronic components 11 can readily be mounted on the multi-piece power module substrate 110 that is not divided. As a result, productivity of the mounting step can be increased, and productivity of the power module 20 can also be effectively increased.

The method for manufacturing a power module substrate and the multi-piece power module substrate 110 according to the embodiment may also include terminal plates 4 and the like in the same manner as the power module substrate 10 according to the above-described embodiment.

Regarding the method for manufacturing a power module substrate and the multi-piece power module substrate 110 according to the above-described embodiment, the example in which the metal mother board 102 or metal plate 2 is bonded to the lower surface opposite to the upper surface of the insulating mother substrate 101 in the same manner as the upper surface is illustrated. The metal plate 2 can also be disposed on the lower surface by the above-described manufacturing method.

Meanwhile, regarding the lower surface side of the insulating mother substrate 101, the heat dissipation plate 5 may be disposed instead of the metal mother board 102 in the same manner as the example of the power module substrate 10 according to the above-described embodiment. Alternatively, for example, the metal mother board 102 (metal plate 2 or heat dissipation plate 5) or a plurality of bonding regions thereof may be bonded to the insulating mother substrate 101 with the second electroplating layer 2 composed of only a nickel layer interposed therebetween.

REFERENCE SIGNS LIST

1 insulating substrate
1a recessed portion
2 metal plate
2a depression
3 first electroplating layer
3a silver layer
3b nickel layer
3bb nickel (in uneven portion)
3c palladium layer
4 terminal plate
5 heat dissipation plate
6 second electroplating layer (nickel layer)
10 power module substrate
11 electronic component
12 resin layer
13 bonding wire
20 power module
30 heat dissipation member
101 insulating mother substrate
102 metal mother board
110 multi-piece power module substrate
115 brazing paste layer
116 plating resist
117 etching resist

The invention claimed is:

1. A power module substrate comprising:
an insulating substrate with an upper surface and a lower surface;
a metal plate with an upper surface and a lower surface, the lower surface facing and being bonded to the upper surface of the insulating substrate; and
a first electroplating layer on part of a central portion of the upper surface of the metal plate,
wherein the first electroplating layer comprises at least a silver layer, and
a grain size of silver in the silver layer is more than or equal to a grain size of a metal in an upper surface portion of the metal plate.

2. The power module substrate according to claim 1, wherein the first electroplating layer further comprises a nickel layer between the silver layer and the upper surface of the metal plate.

3. The power module substrate according to claim 2, wherein an outer perimeter of the first electroplating layer is in an uneven shape in plan view, and
nickel is present in at least part of an uneven portion of the outer perimeter of the first electroplating layer.

4. The power module substrate according to claim 2, wherein an outer perimeter of the first electroplating layer is in an uneven shape in plan view.

5. The power module substrate according to claim 2, wherein the metal plate comprises a depression in a portion along the outer perimeter of the first electroplating layer of the upper surface.

6. The power module substrate according to claim 2 further comprising:
a heat dissipation plate with an upper surface and a lower surface, the upper surface facing and being bonded to the lower surface of the insulating substrate; and
a second electroplating layer on the lower surface of the heat dissipation plate, wherein at least part of an outer perimeter of the second electroplating layer is apart from an outer perimeter of the lower surface of the heat dissipation plate.

7. The power module substrate according to claim 1, wherein an outer perimeter of the first electroplating layer is in an uneven shape in plan view.

8. The power module substrate according to claim 7, wherein the metal plate comprises a depression in a portion along the outer perimeter of the first electroplating layer of the upper surface.

9. The power module substrate according to claim 1, wherein the metal plate comprises a depression in a portion along the outer perimeter of the first electroplating layer of the upper surface.

10. The power module substrate according to claim 9, wherein an inner side surface of the depression is inwardly inclined or curved from an opening toward a bottom of the depression.

11. The power module substrate according to claim 9, wherein surface roughness of an inner side surface of the depression is more than surface roughness of the upper surface of the metal plate.

12. The power module substrate according to claim 9 further comprising:
a heat dissipation plate with an upper surface and a lower surface, the upper surface facing and being bonded to the lower surface of the insulating substrate; and
a second electroplating layer on the lower surface of the heat dissipation plate,
wherein at least part of an outer perimeter of the second electroplating layer is apart from an outer perimeter of the lower surface of the heat dissipation plate.

13. A power module comprising:
the power module substrate according to claim 12;
an electronic component on the first electroplating layer of the power module substrate; and
a resin layer disposed over the outer perimeter of the lower surface of the heat dissipation plate to the electronic component.

14. A power module comprising:
the power module substrate according to claim 9;
an electronic component on the first electroplating layer of the power module substrate; and
a resin layer disposed over a portion with no first electroplating layer of the upper surface of the metal plate to the electronic component.

15. The power module substrate according to claim 1 further comprising:
a heat dissipation plate with an upper surface and a lower surface, the upper surface facing and being bonded to the lower surface of the insulating substrate; and
a second electroplating layer on the lower surface of the heat dissipation plate,
wherein at least part of an outer perimeter of the second electroplating layer is apart from an outer perimeter of the lower surface of the heat dissipation plate.

16. The power module substrate according to claim 15, wherein the second electroplating layer comprises a nickel layer as a primary component.

17. A power module comprising:
the power module substrate according to claim 15;
an electronic component on the first electroplating layer of the power module substrate; and
a resin layer disposed over the outer perimeter of the lower surface of the heat dissipation plate to the electronic component.

18. A power module comprising:
the power module substrate according to claim 1;
an electronic component on the first electroplating layer of the power module substrate; and
a resin layer disposed over a portion with no first electroplating layer of the upper surface of the metal plate to the electronic component.

* * * * *